(12) United States Patent
Coyne et al.

(10) Patent No.: US 9,252,260 B2
(45) Date of Patent: Feb. 2, 2016

(54) SEMICONDUCTOR DEVICE, AND A METHOD OF IMPROVING BREAKDOWN VOLTAGE OF A SEMICONDUCTOR DEVICE

(71) Applicant: ANALOG DEVICES GLOBAL, Hamilton (BM)

(72) Inventors: Edward John Coyne, Athenry (IE); Breandan Pol Og O hAnnaidh, Raheen (IE); Seamus P. Whiston, Raheen (IE); William Allan Lane, Waterfall (IE); Donai P. McAuliffe, Raheen (IE)

(73) Assignee: Analog Devices Global, Hamilton (BM)

( * ) Notice: Subject to any disclaimer, the term of this patent is extended or adjusted under 35 U.S.C. 154(b) by 0 days.

(21) Appl. No.: 13/939,556

(22) Filed: Jul. 11, 2013

(65) Prior Publication Data

US 2015/0014791 A1 Jan. 15, 2015

(51) Int. Cl.
*H01L 29/66* (2006.01)
*H01L 29/78* (2006.01)
*H01L 29/06* (2006.01)
*H01L 29/40* (2006.01)
*H01L 29/423* (2006.01)
*H01L 29/08* (2006.01)
*H01L 29/10* (2006.01)

(52) U.S. Cl.
CPC .............. *H01L 29/78* (2013.01); *H01L 29/063* (2013.01); *H01L 29/1095* (2013.01); *H01L 29/66477* (2013.01); *H01L 29/66681* (2013.01); *H01L 29/7824* (2013.01); *H01L 29/0878* (2013.01); *H01L 29/1083* (2013.01); *H01L 29/402* (2013.01); *H01L 29/404* (2013.01); *H01L 29/42368* (2013.01)

(58) Field of Classification Search
USPC ........... 257/E21.023, E21.135, E29.256, 329, 257/339; 438/510, 531, 545, 555
See application file for complete search history.

(56) References Cited

U.S. PATENT DOCUMENTS

| 2007/0063293 | A1 | 3/2007 | Terashima | |
| 2007/0278570 | A1 | 12/2007 | Knaipp et al. | |
| 2010/0001344 | A1* | 1/2010 | Stefanov et al. | 257/339 |
| 2011/0241114 | A1 | 10/2011 | Su et al. | |
| 2012/0043608 | A1* | 2/2012 | Yang et al. | 257/336 |
| 2013/0071994 | A1 | 3/2013 | Tsuchiko | |
| 2013/0134512 | A1* | 5/2013 | Cheng et al. | 257/339 |

FOREIGN PATENT DOCUMENTS

TW 201238047 A 9/2012

OTHER PUBLICATIONS

Extended European Search Report dated Mar. 4, 2015 for European Patent Application No. 14173773.4, 6 pages.
Kwon, T.H., et al., "Newly Designed Isolated RESURF LDMOS Transistor for 60V BCD Process provides 20V Vertical NPN Transistor," Device Research Conference, 60*th* DRC. Conference Digest, Jun. 24, 2002, pp. 67-68.
Park, J.M., et al., "New SOI lateral power devices with trench oxide," Solid-State Electronics, Elsevier Science Publishers, vol. 48, No. 6, Jun. 1, 2004, pp. 1007-1015.
Office Action dated Jul. 23, 2015 in Taiwan Application No. 103120999, 9 pages, 8 pages translation.

* cited by examiner

*Primary Examiner* — Telly Green
(74) *Attorney, Agent, or Firm* — Knobbe, Martens, Olson & Bear, LLP

(57) ABSTRACT

A semiconductor device having a first layer adjoining a semiconductor layer, and further comprising at least one field modification structure positioned such that, in use, a potential at the field modification structure causes an E-field vector at a region of an interface between the semiconductor and the first layer to be modified.

21 Claims, 17 Drawing Sheets

SEMICONDUCTOR DEVICE, AND A METHOD OF IMPROVING BREAKDOWN VOLTAGE OF A SEMICONDUCTOR DEVICE

FIELD

The present disclosure relates to improvements in the performance of semiconductor devices, such as field effect transistors.

BACKGROUND

High voltage field effect transistors are known. A limit on the performance of such devices is the maximum voltage across the device that they withstand before breakdown mechanisms cause the current flow in the device to increase in an uncontrolled manner. This leads to loss of control of the device, and often to device failure due to ohmic heating of the device. One known way to increase the breakdown voltage is to use "field plates" to allow depletion regions to extend over greater distances with the device, thereby reducing local electric field strengths. However devices employing this technique may not last as long as expected.

SUMMARY

The present document discloses methods and structures for modifying the direction of electric fields at the interface between a semiconductor region of an active device, such as a field effect transistor (FET), and a dielectric layer disposed adjacent such a semiconductor region. Such a modification of electric field direction has been found by the inventors to modify processes within the device that lead to a degradation of breakdown performance as a result of using the device.

Disclosed herein is a semiconductor component having a conductive structure located beneath an active region of the semiconductor component, wherein the conductive structure can be driven to a potential, or float to a potential, such that it causes a modification of an electric field component at an interface between the active region of the semiconductor and an insulator, or a further layer of material.

It is thus possible to provide a semiconductor device, such as a field effect transistor, having a first layer of material adjoining a semiconductor layer, the device further comprising at least one field modification structure positioned such that, in use, a potential at the field modification structure causes an electric field vector at a region of the interface between the semiconductor and the first layer to be modified.

The at least one field modification structure may be formed beneath the semiconductor device. "Beneath" in this context indicates that the structure is closer to the middle or back of the substrate in which the active region of the device is formed. Thus, the device lies between the field modification structure and metal layer(s) formed so as to interconnect devices together.

In some embodiments the device may have reduced surface field (RESURF) structures, such as field plates. Such RESURF structures are generally at a potential similar to that of a gate (or base of a bipolar transistor) or a source (or emitter for a bipolar device). In those embodiments the field modification structure is not part of the RESURF structure, in that the field modification structure or structures are not provided above the device and are not provided at the gate or source potential. In some embodiments a field modification structure may be connected to, or be at, a drain (or collector for a bipolar device) potential.

This document further discloses a semiconductor device comprising:
a RESURF structure located adjacent a surface of a first semiconductor region, the RESURF structure having a first boundary region;
the semiconductor device further comprising a conductive structure having a conductive structure boundary region substantially aligned with the first boundary region, and at least one component connected to the conductive structure to enable a voltage to be applied to the conductive structure.

The semiconductor device may be a transistor such as a FET. The inventors realized that some aspects of the FET device physics make such devices, and especially P-type devices, vulnerable to failure modes resulting from charge trapping. The FET may be a lateral FET, where the channel is oriented generally parallel to the substrate surface, and the first boundary region may occur between a drain and a gate of the FET.

By provision of additional structures within the semiconductor device it is possible to induce a modification of E-field direction in the vicinity of the edge of, for example, a field plate. Modification of E-field direction can modify the risk of charge becoming trapped within a dislocation within a dielectric as a result of quantum tunneling effects. However it does not significantly change the probability of trapped charge escaping.

In some embodiments the device comprises two or more field modification structures. The device may comprise two structures beneath the device. These structures may be formed at different depths and/or different positions beneath the device. The two field modification structures may, in use, be driven two different voltages or may float to different voltages.

Also disclosed herein is a method of improving breakdown performance of a semiconductor device having a dielectric layer, or indeed some other layer, adjacent a semiconductor, the method comprising applying a modifying electric field over at least a part of an interface region between the semiconductor and the dielectric so as modify a direction of an electric field at the part of the interface region.

Advantageously the semiconductor device has a RESURF structure having an end or boundary portion, and the part of the interface region is in the vicinity of the end or boundary region. In this context "vicinity" may ignore distance in a direction perpendicular to a plane of a wafer in which the device is formed. The horizontal distance will depend upon the overall device architecture and technology node.

It is thus possible to provide a method of improving breakdown performance of a semiconductor device having a RESURF structure adjacent a surface of a first semiconductor region, and where the RESURF structure has a boundary region, the method comprising applying a modifying electric field so as to modify electric field gradients at a surface of the first semiconductor region adjacent the boundary region of the RESURF structure.

This document also discloses methods for fabricating a semiconductor device in which the active (current carrying) regions of the semiconductor are adjacent an interface with an insulator so as to form structures for modifying E-fields at specific regions.

BRIEF DESCRIPTION OF THE DRAWINGS

Some embodiments will now be described, by way of non-limiting example only, with reference to the accompanying Figures, in which.

DETAILED DESCRIPTION OF THE PREFERRED EMBODIMENT

Within the description terms such as horizontal, vertical, above, below, left and right, and so on, are used merely to describe the relative positions of objects as shown in the Figures and are not to be construed as limitations within actual semiconductor devices. Relative concentrations of donors or acceptors within a device may be designated N and P, and modified by "−" to show reduced doping or by "+" to show enhanced doping. These notations are known to the person skilled in the art.

Figure 1:
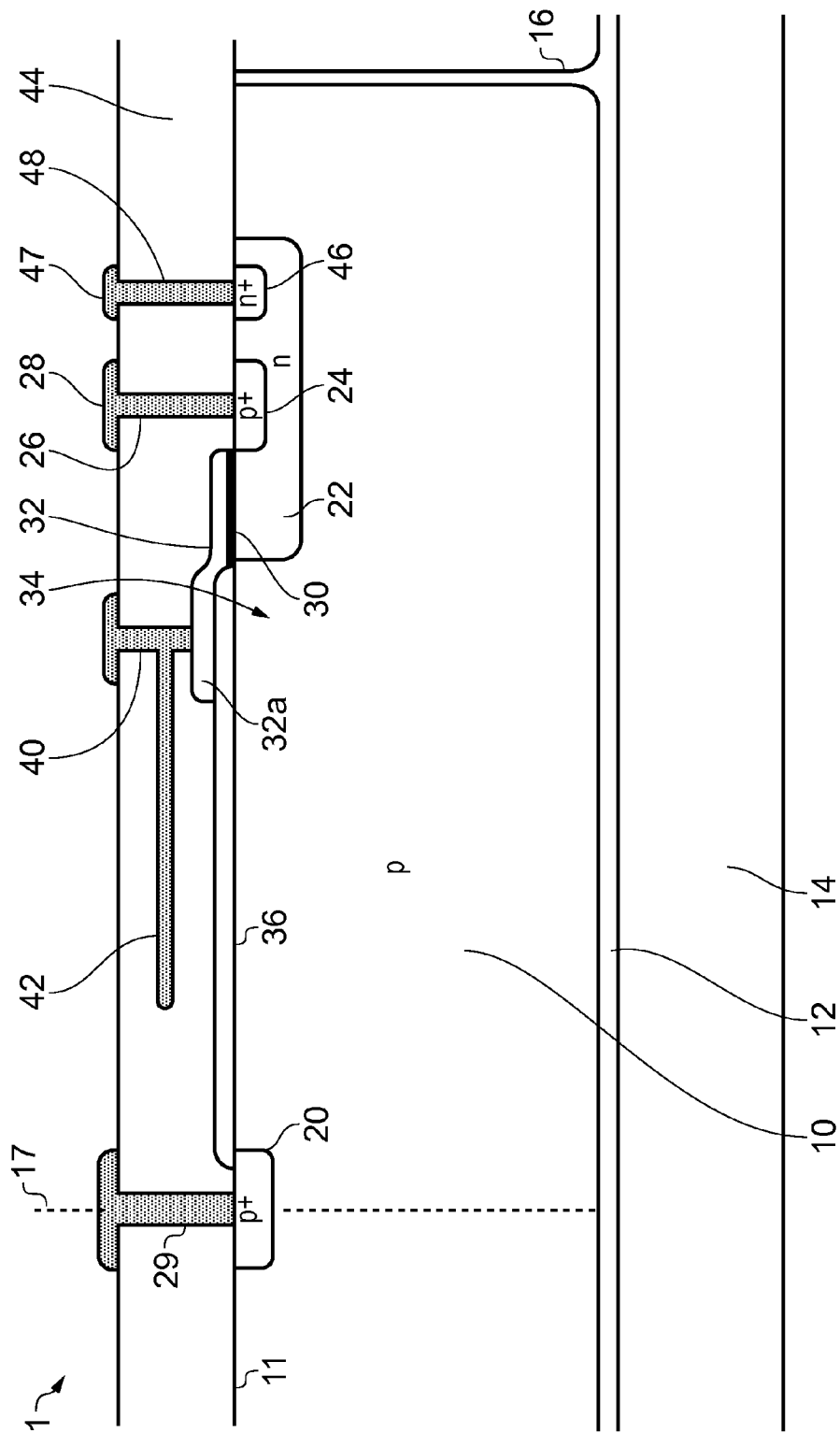
FIG. 1 is a schematic cross-section through a known DMOS FET.

FIG. 1 is a schematic diagram of a known field effect transistor generally designated 1. A discussion of the structure of a known field effect transistor, and some of the mechanisms leading to degradation of its breakdown performance, is presented in order to facilitate the reader in understanding the benefits that the teachings of this disclosure provide.

The field effect transistor shown in FIG. 1 comprises a body region 10, which in this example is formed of a P-type semiconductor material. The body region 10 is insulated from other devices formed as part of the same integrated circuit as the transistor of FIG. 1. Such isolation may be achieved by formation of a reversed biased junction around the P-type body or, as shown in FIG. 1 by the use of silicon on insulator technology. Within a silicon on insulator device the lowermost surface of the body 10 is bounded by an insulating layer 12, for example of silicon dioxide provided over a handle wafer 14. During fabrication of the device vertical trenches are formed which are then also infilled with an insulator 16, again such as silicon dioxide. In three dimensions, insulating walls are also formed above and below the plane of the cross-section of FIG. 1 such that the body 10 of a device sits within an insulating box. The use of such fabrication techniques, i.e., SOI or the formation of reversed biased junctions to form isolation between adjacent devices, is well known to the person skilled in the art and need not be described further.

The device shown in FIG. 1 exhibits mirror symmetry about a plane of symmetry 17 which passes through a P$^+$ doped region which forms its drain 20. However, for convenience, only half of the device 1 need be illustrated and described in order to understand its operation. The transistor 1 comprises a channel region doping 22 of an N-type semiconductor. Within the channel region 22 a relatively heavily doped P$^+$ region 24 is formed which serves to form the source of the field effect transistor. The region 24 may have a further more heavily doped P$^{++}$ region (not shown) formed within it in order to facilitate a good low resistance connection to a metallic via 26 which serves to connect the region 24 to a metal layer 28 for device interconnection purposes. Similarly the drain region 20 may have a more heavily doped P$^{++}$ region (not shown) contained within it to provide a low resistance contact region to a metallic via 29 that serves to provide a connection to the drain 20. A thin oxide layer 30 extends from the edge of the P$^+$ source region 24 over the N-type channel 22 in the direction of the drain 20. The relatively thin insulating region 30 stops just after it passes the notional edge of the channel region 22. A conductive element 32, for example of metal or polysilicon, is formed over the thin oxide layer 30. This conductive element 32, which in this example is a layer of conductive polysilicon, forms the gate electrode which is insulated from the N-type channel 22 by the thin insulating oxide layer 30. In a low voltage transistor, the drain would be formed at the end of the insulating layer 30 in much the same way as the source region 24 is. The P-type material in the region generally designated 34 at the left edge of the N-type region 22 can be regarded as forming the drain of a relatively low voltage device. However for the illustrated device it can also be seen that a significant distance exists between the region 34 and the actual drain 20 as formed by the implanted region of P-type material, designated P$^+$ to show that it has a higher doping density than the P-type region 10 forming the body of the device. Due to the resistive nature of the semiconductor material, a potential divider is effectively formed between the drain region 20 and the region 34. This potential dividing action gives the transistor its high voltage capability. However, another feature of the device which improves its voltage capability is the provision of "RESURF" structures (RESURF stands for "reduced surface field") which act to replicate the gate voltage over selected portions of the semiconductor material. Thus, in this example, a thicker layer of oxide 36, sometimes known as a field oxide, is formed above the surface of the P-type material 10 extending from the edge of the N-type channel 22 to the edge of the P-type drain region 20, and the polysilicon gate electrode 32 is extended over a portion of the field oxide 36 to form part of a RESURF structure. The left hand half, overlying the field oxide 36 and generally designated 32a, of the polysilicon gate conductor 32 effectively acts to form a first field plate. Part of the field plate may be formed by a conductive track placed further from the surface 11 of the bulk semiconductor material 10. It is known to the person skilled in the art that several metal interconnect layers are typically formed above a semiconductor substrate, and these are typically referred to as metal1, metal2, metal3 and so on with increasing distance from the surface 11. Thus, as shown in FIG. 1 a metallic via 40, which serves to establish a connection with the polysilicon layer 32, may also connect with a further field plate 42 formed, for example, as part of the metal1 layer of the device. Thus the field plate 42 extends the gate potential farther towards the drain 20, but at an enhanced distance from the surface 11 of the P-type material. The field plate 42 may be formed within an insulating layer 44 (or layers) which may be silicon-dioxide or some other insulator such as nitride.

The action of the RESURF mechanism, such as the field plates 32a and 42, is to convert the electric field within the device when it is connected to a supply from being one that exists across the silicon to being a field that exists substantially across the field oxide 36. The silicon dioxide exhibits a much higher breakdown voltage and hence is able to withstand these higher electric fields more readily.

The use of field plates is relatively well documented. It is also known that the field plate(s) can be connected to the source of the transistor instead of to the gate of the transistor. Field plates are also known in the context of bipolar devices, and the techniques and approaches disclosed herein can also be applied in these devices.

It is known that field effect transistors may also have a back gate, and in the arrangement shown in FIG. 1 this is provided by a N+ region 46 within the channel region 22, and which can be connected to a metallic contact 47 by way of a via 48.

By suitable selection of doping levels the FET of FIG. 1 can be configured as an enhancement mode or depletion mode device as known to the person skilled in the art of device fabrication.

Figure 2:
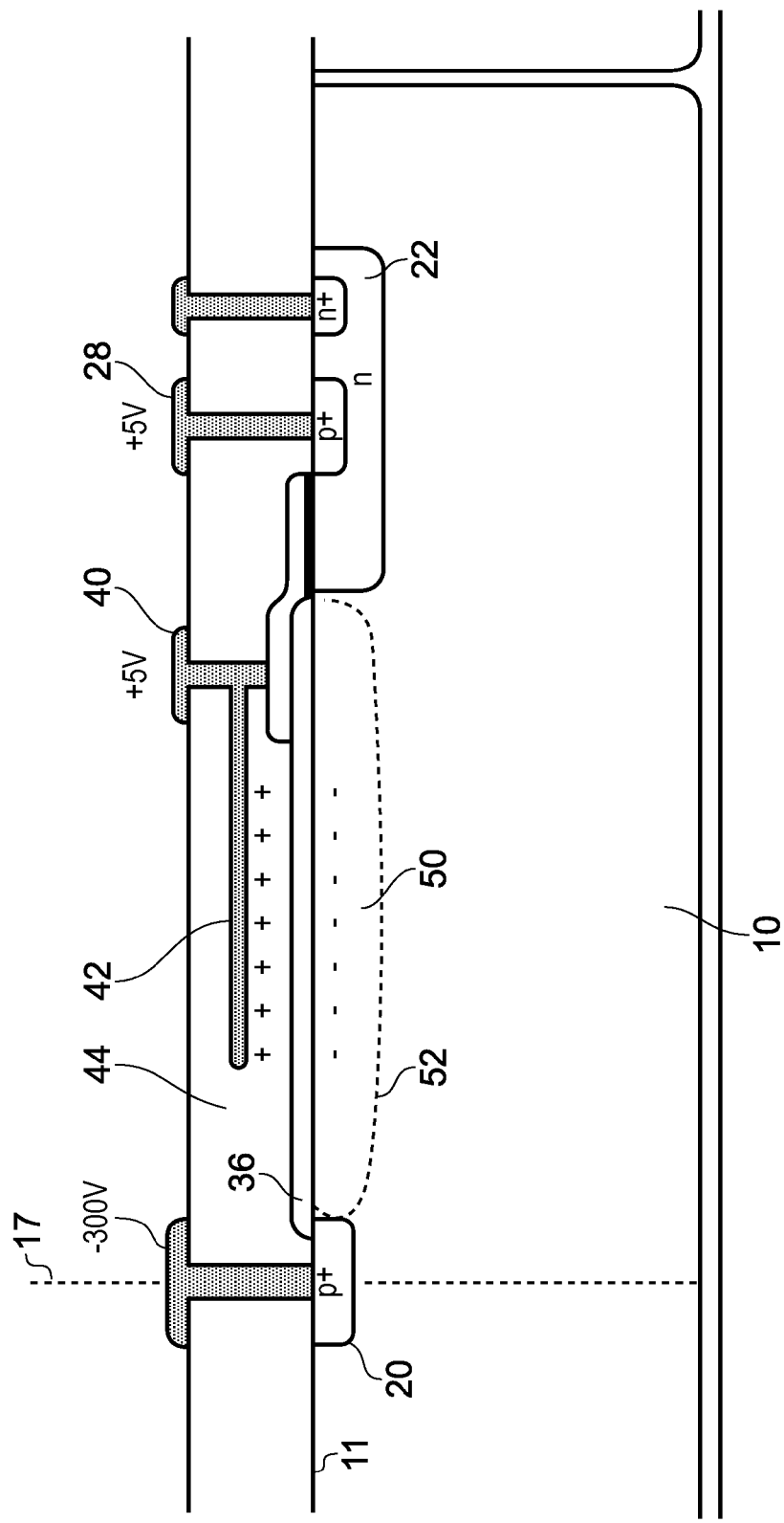
FIG. 2 schematically illustrates regions of the device of FIG. 1 where charges can exist during operation of the device and where thermal generation of minority carriers may result in those minority carriers becoming trapped at or adjacent an interface between semiconductor regions and an insulator.

FIG. 2 shows the device structure of FIG. 1, but now the relative voltages on the drain, gate and source have been added for a PMOS device operating with a 300 volts supply. Thus, the source 28 could be assumed to be at zero volts or at a typical logic voltage of +3 or +5 volts. The gate 40 is typically driven with a logic signal which has a magnitude of only a few volts, and the drain may be several hundred, for example 300 volts, more negative than the source voltage. For simplicity, the source contact 28 will be assumed to be at +5 volts, the gate will also be at +5 volts (so an enhancement mode device is in a non-conducting state) and the drain is at −300 volts. It can therefore be seen, because the drain to source voltage is dropped across an extended drain region 50 generally enclosed by the chain line 52, that the field plate 42 is at a potential that can be significantly greater than that of the surface 11 of the semiconductor material lying immediately beneath the field plate 42. This is indicated by the bottom of the field plate being labeled with a "+" to demonstrate its relatively positively charged state, and the surface 11 being labeled with a "−" to designate its relatively negatively charged state.

Although the device of FIGS. 1 and 2 is a PMOS device, and hence the majority carriers within the semiconductor are positively charged holes, there will inevitably be some minority carriers (electrons) generated due to thermal effects within the device. Any minority carriers which occur in the extended drain region generally designated 50 beneath the field plate 42 may become swept by the electric field from the field plate 42 towards the field oxide 36. These free electrons can quantum tunnel into the body of field oxide 36 and become trapped at dislocations within the oxide. It should also be noted that trapped electrons can thermally relax out of the oxide 36. However, over time the interface region between the field oxide 36 and the surface 11 of the P-type semiconductor 10 can acquire a negative charge which serves to reduce the electric field generated from the field plate. This in turn causes more of the electric field between the source and drain to be seen by the semiconductor adjacent the surface 11. The presence of an increased electric field increases the chance of electrons being stripped from the semiconductor lattice and being accelerated towards adjacent semiconductor atoms, thereby giving rise to an avalanche breakdown.

Figure 3:
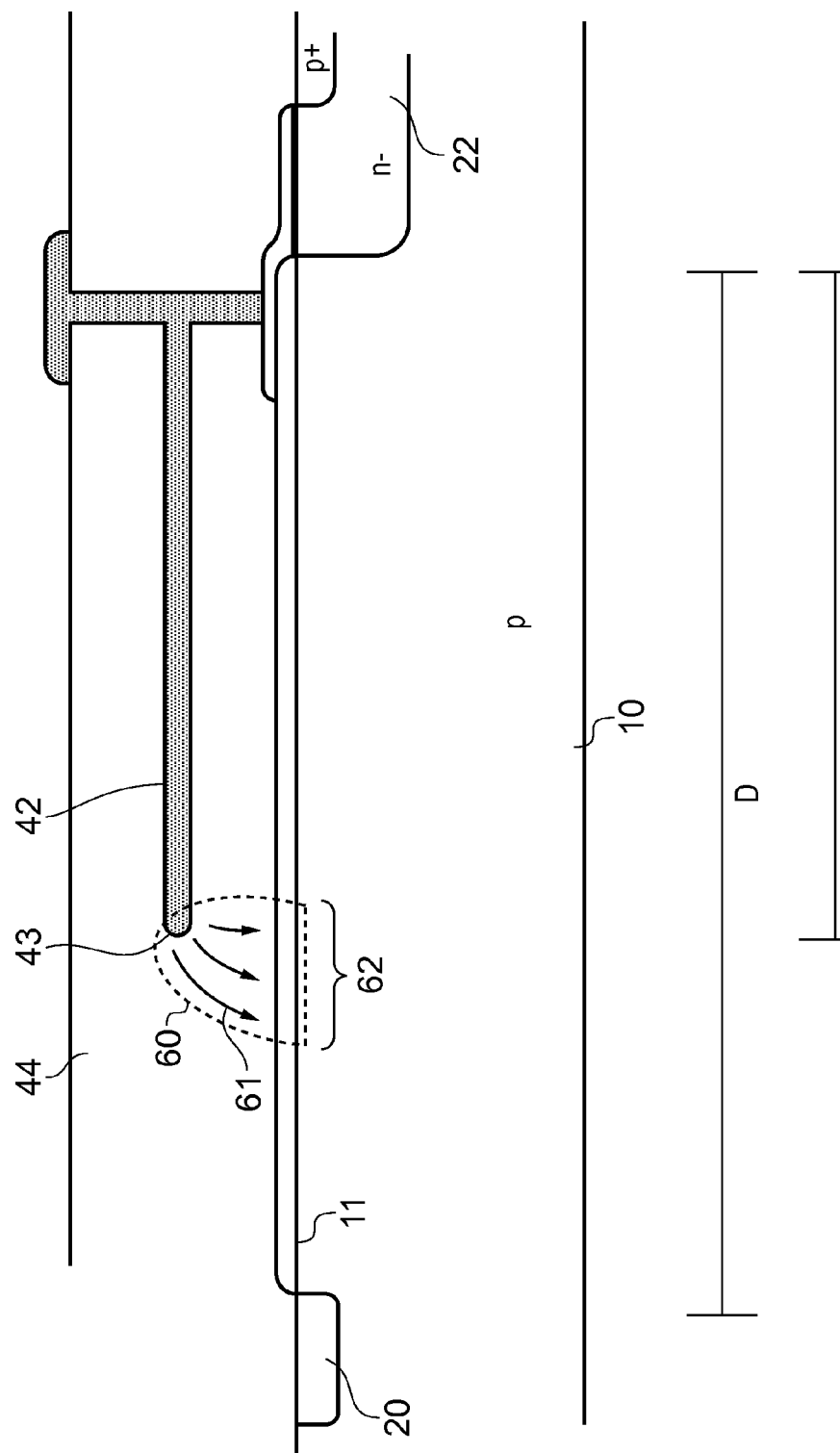
FIG. 3 schematically illustrates the existence of electric fields at the boundary or edge of a field plate, and how these can cause charge trapping in a semiconductor-to-insulator interface region that is adjacent but not vertically overlapped by a field plate.

A further feature of RESURF structures such as field plates is that the electrostatic field strength varies at the ends of such a structure. To a first approximation, the electrostatic field varies as a function of the radius of curvature from the end of a field plate. This is one reason why it is beneficial to form the field plate at an increased distance from the surface 11 by using the metal layer. Referring to FIG. 3, the end 43 of the field plate gives rise to an area of enhanced electrostatic field, schematically represented by E-field vector 61, which broadly speaking exists within the area encompassed by the dotted line 60. It can therefore be seen that a region, generally designated 62, of the surface 11 of the P-type material 10 also can become negatively charged and that the region 62 lies between the end 43 of the field plate 42 and the drain 20.

Figure 4:
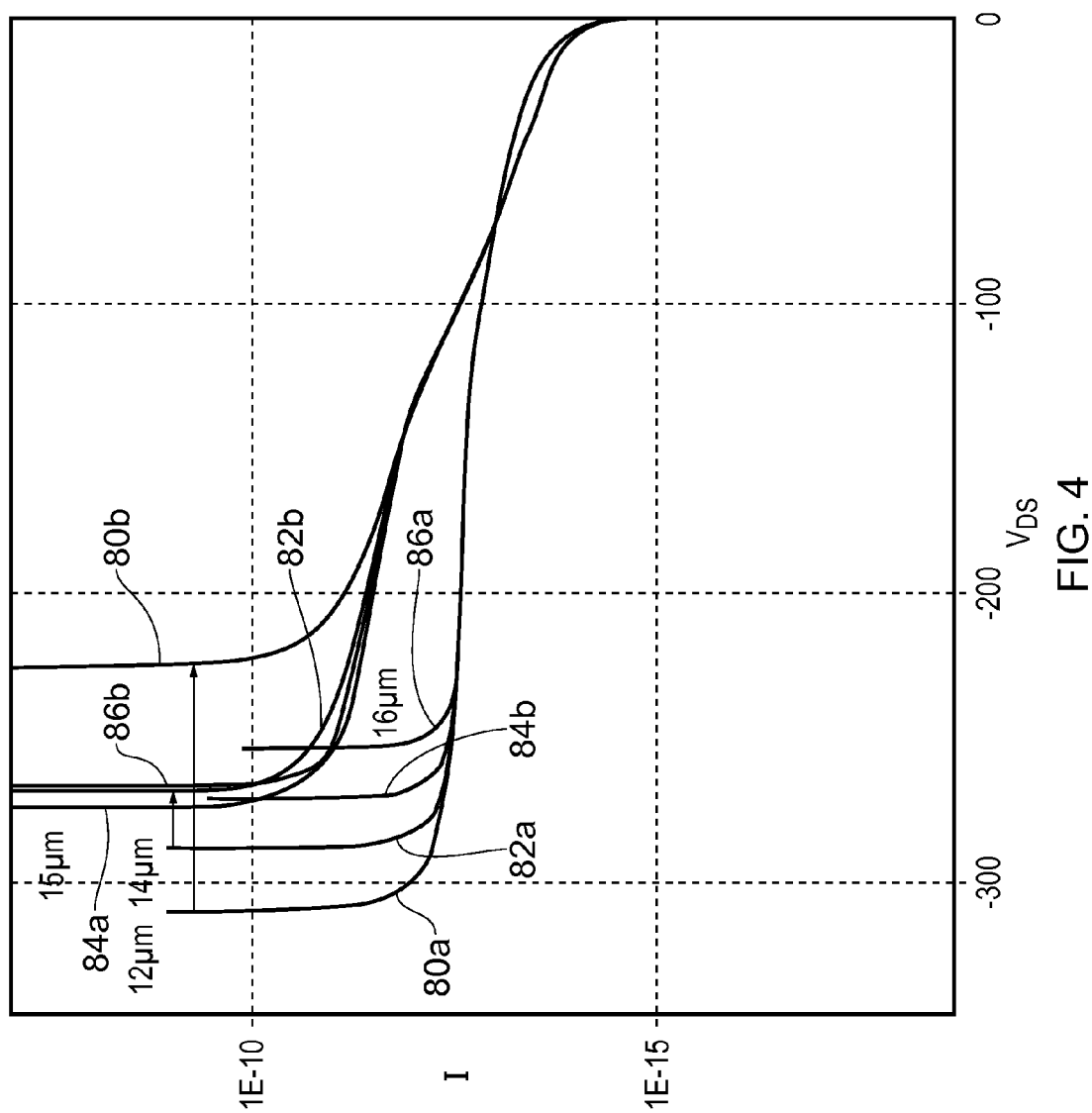
FIG. 4 is a graph showing the evolution of device breakdown voltage with continuing use of the device for a series of different lengths of field plate within a field effect transistor.

For a given device, there is a interplay between the length of the field plate and the breakdown voltage, and the evolution of the breakdown voltage with respect of time. A series of experiments were done for a device where, as shown in FIG. 3, the distance D between the edge of the drain implant 20 and the edge of the channel implant 22 was 24 μm, and the distance F between the end of the channel implant 22 and the edge 43 of a field plate 42 was varied to be 12, 14, 15 and 16 microns (μm). Performance of these devices, in terms of off stake leakage current versus drain source voltage are shown in FIG. 4. The drain in this example is more negative than the source, and consequently the magnitude of the voltage across the device increases as one moves from the right edge of the graph to the left hand side of the graph. In each of the plots, the designation "a" corresponds to the performance of a device when it is new, and the designation "b" corresponds to the performance of the device once it has reached its steady state in terms of charge trapping within the field oxide 36. Thus, for a device in which the field plate F extends by 12 microns from the edge of the channel doping 22 the initial breakdown voltage is somewhere in the region of −300 volts (curve 80a), but with the passage of time this evolves to approximately −220 volts as designated by curve 80b. This is known as "walk-in" of the breakdown voltage. For a device where the distance is 14 microns, the initial breakdown voltage is approximately −280 volts as designated by line 82a, but this reduces to approximately −250 volts as designated by line 82b. For a device where the field plate extends by 15 microns, the initial breakdown voltage is approximately −260 volts (curve 84a), and remains substantially unchanged (curve 84b). Thus the voltage does not "walk-in" from its initial value to a steady state value in this case. For a device where the length F is 16 microns the initial breakdown voltage is approximately −240 volts (curve 86a) and here charge trapping results in the breakdown voltage "walking-out" to approximately −250 volts (curve 86b) with the passage of time. Thus, after some significant effort, the inventors had gained some experience of degradation in transistor breakdown voltage occurring during use of the transistor, and had developed an understanding of why this occurred. The change of breakdown voltage with respect to use of the device can be regarded as a degradation of the breakdown voltage.

Figure 5:
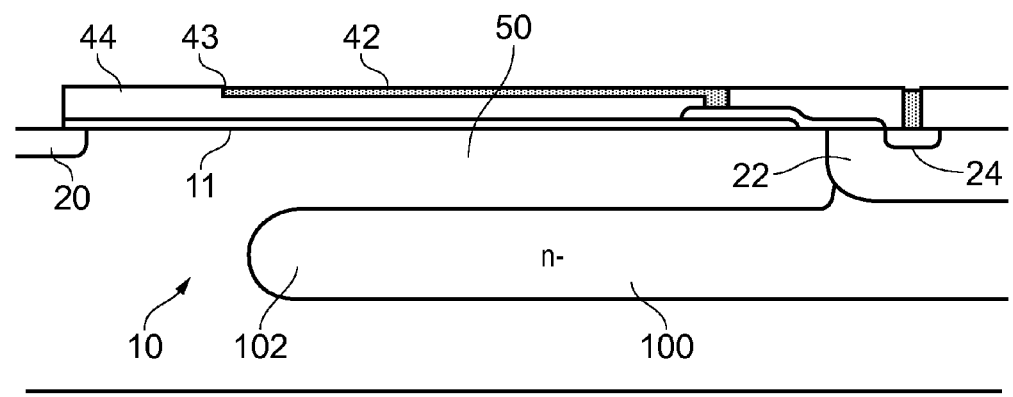
FIG. 5 is a cross-section through an embodiment of a semiconductor device in which an additional structure has been provided.
Figure 6:
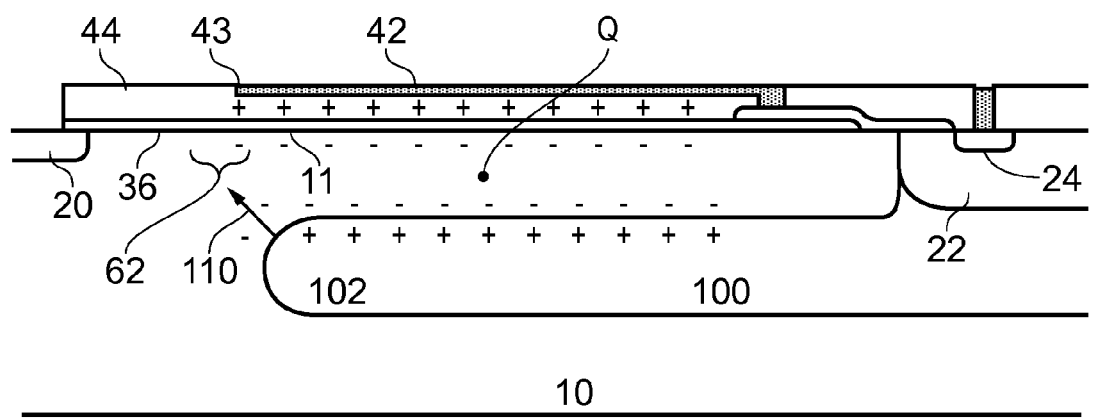
FIG. 6 schematically shows a distribution of charges within the device of FIG. 5 when a potential difference exists between drain and source nodes of the device.

The inventors realized that the degradation process could be inhibited, or at least reduced, by modifying the electric field gradients giving rise to charge trapping at the semiconductor to insulator interface. One way of achieving this is to form an electric field modifying structure beneath the active region of the semiconductor device. Such a structure is shown in FIG. 5. Here, the device shown in FIG. 5 is similar to that shown in FIG. 1, in that RESURF structures extend from the edge of the channel implant 22 towards the drain implant 20. Here the field plate 42 has been shown as being at the upper surface of the insulator 44 as opposed to being embedded in it. This makes no functional difference, but is merely included to show that this option exists. However, more significantly, a conductive structure 100 has been formed underlying some of the extended drain region 50 of the transistor. It should be noted that in this FET most of the current flows in a thin layer adjacent the surface 11 of the bulk semiconductor 10. Thus the current carrying part of the transistor is, in reality, a relatively thin layer of semiconductor close to the surface 11. Thus, by burying the conductor structure 100 within the bulk of the material 10, the active part of the transistor is effectively sandwiched between the conductor structure 100 and the RESURF structure 42. The conductor structure 100 is, in FIG. 5, shown as an elongate finger of lightly doped N-type semiconductor material extending from the channel doping 22 towards the end 43 of the field plate 42. The degree of doping, of course, will depend upon the overall device architecture, including the technology node and relative doping of other lightly doped, very lightly doped, heavily doped or very heavily doped regions. A typical doping concentration for the lightly doped conductor structure 100 of the illustrated device is in the range of $10^{14}$ to $10^{17}$ atoms/cm$^3$. Thus, the conductive structure 100 of this embodiment has the same type of conductivity (albeit less concentrated) as the channel region 22, and opposite to that of the extended drain region 50. The conductive structure 100 effectively has a boundary region or end region, generally designated 102, that substantially aligns with the end 43 of the field plate 42 or at least is in the vicinity of the end 43. Thus, the distance F for the RESURF structure substantially corresponds to the distance between the boundary region 102 of the conductive structure 100 and the edge of the channel implant 22. The horizontal distance between field plate end 43 and conductive structure end region 102 will depend upon the overall device architecture and technology node. For the illustrated devices, for example, the end 43 of the field plate 42 may be within about 0-3 μm of the end 102 of the conductive structure 100, more particularly within about 0-2 μm. The N-type material, being connected to the channel doping, is substantially at zero volts at one end of the structure 100, whereas as noted earlier the drain can be at a potential of −200 to −300 volts. Thus as known to the skilled person a depletion region is formed between the N-type material within the conductor structure 100 and the body material 10 of the field effect transistor. FIG. 6 shows the device of FIG. 5, with the effects of the various electric fields giving rise to formation of charged regions of the semiconductor materials 10 and 100. Thus, because of the existence of the depletion resulting from the interface of the conductive structure 100 and the bulk of the material 10, the interior of the conductive structure 100 becomes positively charged, and a series of negative charges sit above it. The negative charges also exist around the boundary region 102 of the conductive structure 100.

Initially, it can be seen that if a thermally generated minority carrier would come into existence for example at point Q halfway between the channel implant 22 and the end 43 of the field plate 42, then there would now be a counterbalancing E-field which would to some extent reduce the tendency of the free electron to move towards the surface 11 of the bulk semiconductor 10 and thereby the opportunity to undergo quantum tunneling and entrapment of the insulator 36.

The metallic field plate 42 by definition serves as an equipotential surface and thus the same voltage exists all the way along its length. By contrast, the relatively lightly N-type doped region 100 is quite resistive, and therefore a potential difference can exist across it between the boundary region 102 and its connection to the channel implant 22. Thus the electrostatic field urging electrons to move towards the surface 11 is not completely eliminated, but it is slightly reduced, and this in turn improves the chances of the electrons recombining before they reach the surface. Thus some improvement occurs along the length of the conductive region 100. However, and less intuitively, most of the improvement comes at the end portion 102.

Referring back to FIG. 3, it was noted that for a device in use an E-field exists beyond the end 43 of the field plate 42, and hence electrons also become trapped in the region 62 which exists between the end 43 of the field plate 42 and the drain 20. Similarly, a field exists beyond the end of the boundary region 102 of the conductive structure 100.

Thus as shown schematically in FIG. 6 by vector 110 an E-field extends in a direction that is both upward, i.e. towards the field plate 42, and also inclined so that it has a component in the direction of the drain 20. In other words the E-field 110 from the boundary region 102 of the conductive structure 100 has both a horizontal component toward the drain 20 (parallel to the substrate surface 11) and a vertical component (perpendicular to the substrate surface 11). This E-field 110 can vectorally sum with the E-fields schematically represented by the arrows, such as arrow 61, in FIG. 3 enclosed within the area 60.

Figure 7:
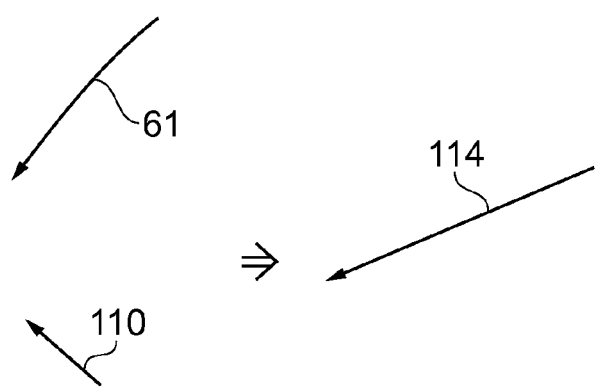
FIG. 7 schematically illustrates the vector addition of electric field vectors in the region 62 of FIG. 6, and the resulting electric field vector.

FIG. 7 diagrammatically represents a vector summation of E-field 110 resulting from the boundary region 102 of the conductive structure 100 and an E-field 61 originating from the end of the RESURF structure, for example field plate 42. Diagrammatically, it can be seen that the result of the vector sum may be that the magnitude of the electric field in the region 62 adjacent the interface between the surface 11 of the semiconductor 10 and the insulator 44 is increased as denoted by vector 114, but direction of the E-field has been modified such that it becomes less inclined with respect to the surface 11 (more inclined with respect to the surface normal). Theoretical work shows that the angle that the E-field makes dramatically affects the probability of a thermally generated free electron quantum tunneling into the insulator and getting trapped at a dislocation therein. However the change in direction of the E-field, or indeed its magnitude, makes substantially no difference to the probability of the trapped electron thermally relaxing out of the defect. Thus, although the E-field magnitude has actually been increased in the region 62, the equilibrium trapped charge value has been decreased by virtue of changing the direction of the E-field.

Figure 8:
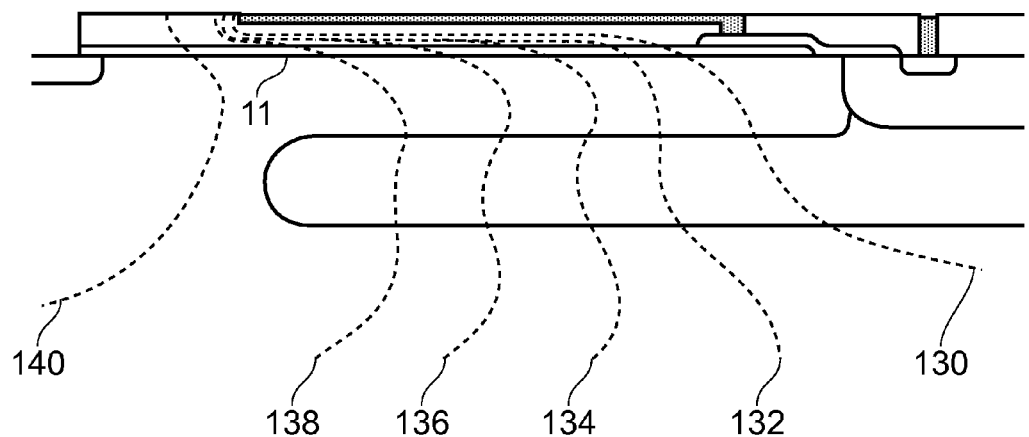
FIG. 8 schematically illustrates equipotentials in the device of FIG. 5 when a potential difference exists between the drain and source thereof.

FIG. 8 schematically illustrates lines of equipotential within the device shown in FIG. 5. Thus, for any one of the lines of equipotential 130, 132, 134, 136, 138 and 140, the voltage at any point along that line is the same as the voltage at any other point along that line. It can be seen that the lines of equipotential are very close to one another in the region underlying the field plate 42 between the plate and the substrate surface 11. This demonstrates that large E-field gradients exist and that the voltage changes rapidly as one moves from the field plate 42 through the oxide and into the surface region 11 of the semiconductor 10. However FIG. 8 also shows that because the N⁻ region of the conductive structure 100 is very lightly doped, the voltage varies with distance along the region 100.

As a result the boundary region 102 floats to a voltage intermediate that of the channel implant (roughly 0 V) and the drain 20. The voltage that region 102 attains for a given potential difference across the transistor can be varied by the designer choosing to vary the doping of the conductive structure 100, of the body 10 (including the extended drain region 50) or both of these.

Figure 9:
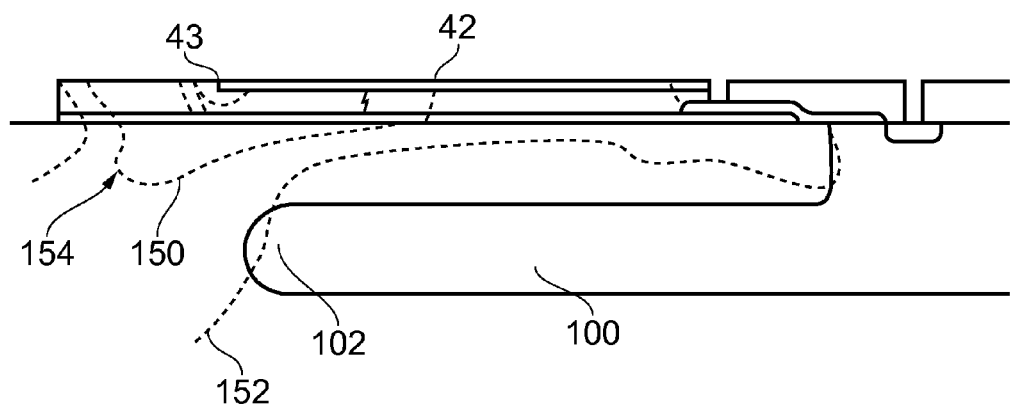
FIG. 9 schematically illustrates electric field strengths in the device of FIG. 5 when a potential difference exists between the drain and source thereof.

FIG. 9 schematically illustrates electric field strength where each line 150 and 152 has the same electric field intensity along it. The majority of the device is within the region encompassed by (which in the orientation of FIG. 9 means beneath) the line 152 which corresponds to a relatively low electric field. However, line 150 which corresponds to a higher electric field gradient has a slight nose region 154 in it where it extends slightly downwardly, indicating the higher electric field strength due to the vectorial sum of the electric fields generated from the end 43 of the field plate 42 and from the end portion 102 of the conductive structure.

Figure 10:
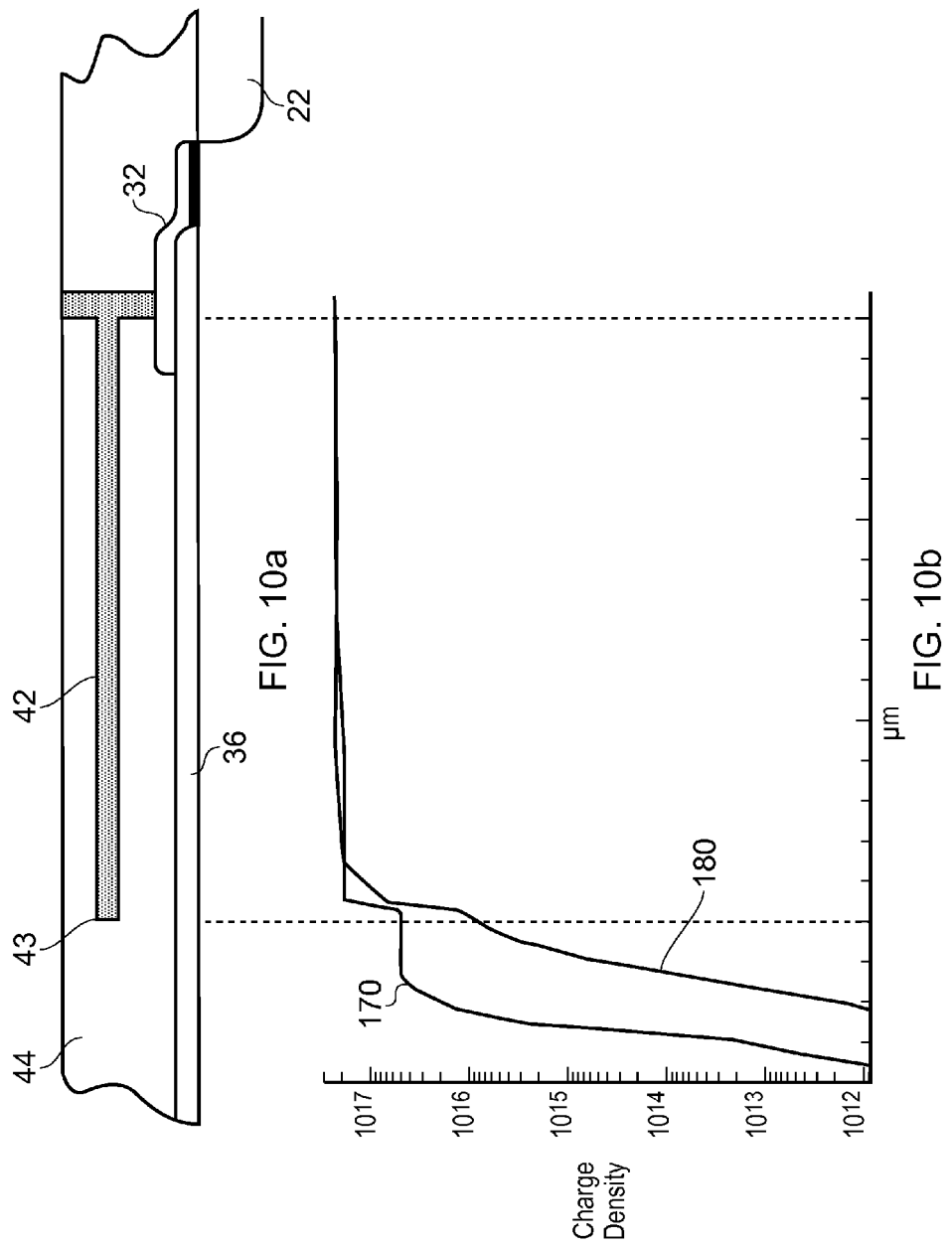
FIG. 10a schematically illustrates a field plate within the device of FIGS. 1 and 5.
FIG. 10b is a graph showing trapped charge density as a function of position for the prior art device of FIG. 1 and the device of FIG. 5 which has an additional structure formed therein so as to modify the electric field direction at the semiconductor-insulator boundary near the end of the field plate.

FIGS. 10a and 10b are provided so as to illustrate the spatial variation of trapped charge. FIG. 10a is an enlarged and simplified view of the transistor in the vicinity of field plate 42.

FIG. 10b schematically illustrates trapped electron concentration in terms of electrons per cubic centimeter within the boundary region of the insulator, as a function of position within the transistor. A surprising thing to note is that even though an E-field exists over the entirety of the conducting structure 100, ultimately it makes very little difference to the trapped electron concentration, except in the vicinity of the end or boundary region 102. However, if we compare the charge trapping density for a prior art transistor, i.e. one without structures 100 and 102, compared to one with the conducting structure, then it can be seen that the charge density varies considerably over region 62 (FIG. 3) spanning a few microns from the end 43 of the RESURF structure 42. The density without the buried conductor structure is illustrated by curve 170 whereas the charge density in transistors having the conductive structure is represented by curve 180. It can be seen on the logarithmic scale of FIG. 10b that the trapped charge density drops by approximately 50 times or so at a distance from 1 micron from end of the RESURF structure, and by about a 1000 times at a distance of 2 microns from the end 43 of the RESURF structure 42.

Figure 11:
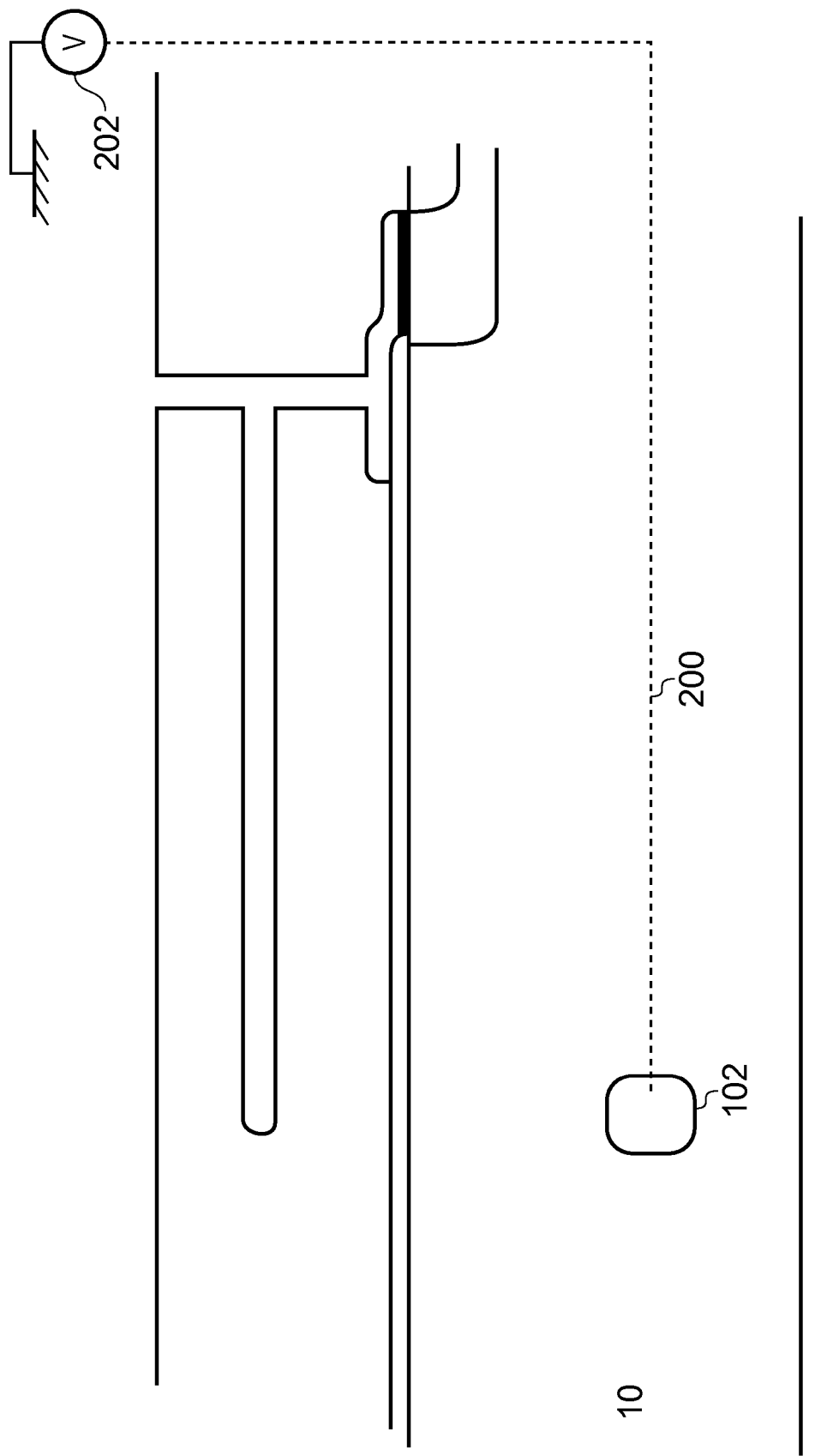
FIG. 11 is a schematic cross-section through another embodiment of a device having a modification structure.

From inspection of charge density simulation of FIG. 10b, we can in fact see that in order to achieve the benefit of improved breakdown voltage by virtue of reducing breakdown voltage walk-in with the device used, it becomes sufficient to provide a conductive structure 102 substantially aligned with, or at least adjacent the end region of the RESURF structure. This arrangement is shown in FIG. 11 where a buried structure 102, for example of an N-type doping, is formed within the P-type body 10, but this time an elongate finger (at least within the plane of the drawing) has not been formed to connect it to the channel implant 22. It is still important that the voltage of the structure 102 can be controlled, as schematically indicated by chain line 200 representing an electrical connection to a voltage source 202. Such an electrical connection can be formed by conductive tracks formed extending laterally of the device structure. Such a transistor structure is shown in plan view in FIG. 12.

Figure 12:
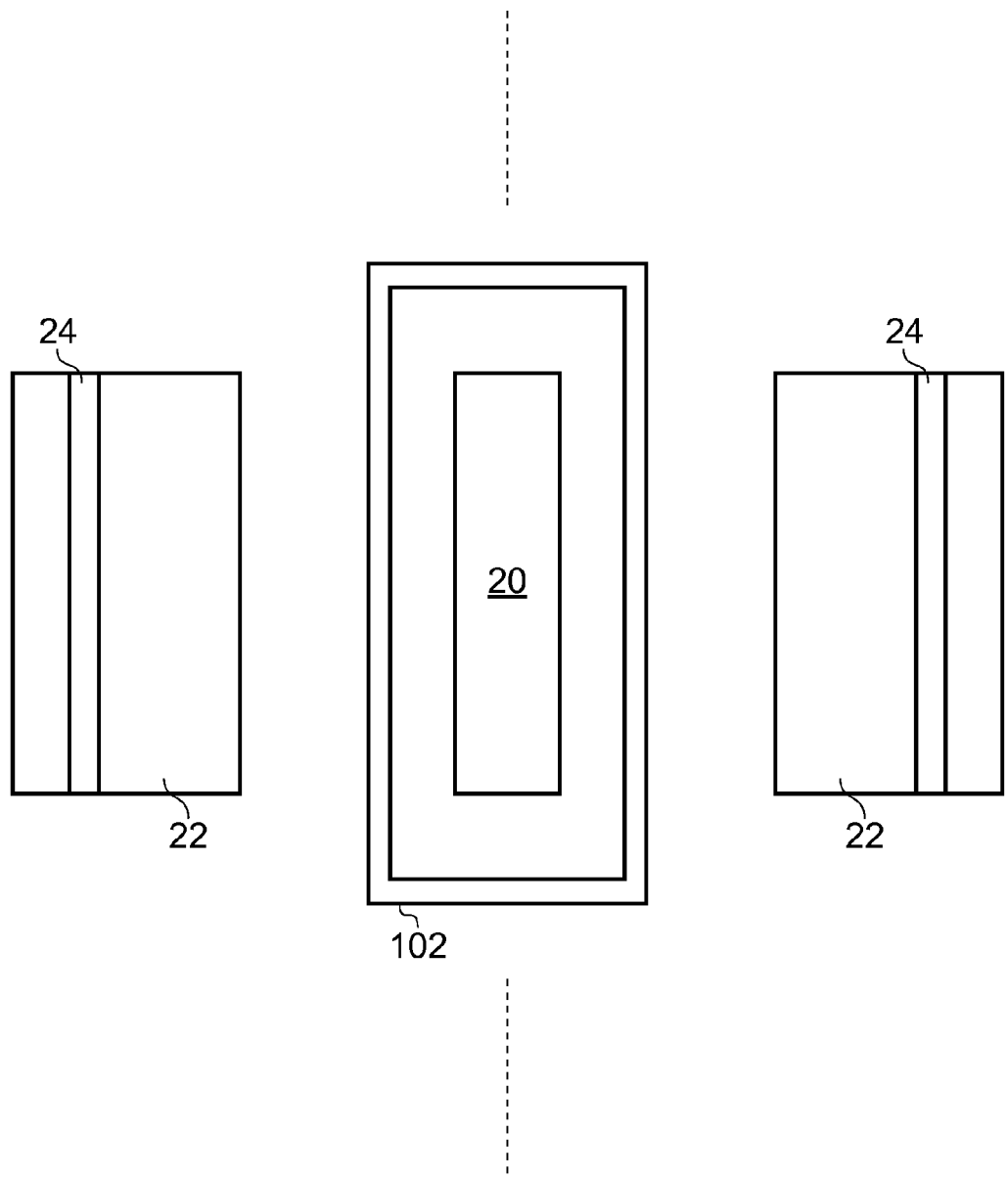
FIG. 12 is a plan view of the device of FIG. 11.

In FIG. 12 the transistor exhibits mirror symmetry about the drain 20. Thus channel implants 22 are formed either side of the drain 20, and each channel implant 22 has a source 24 implanted therein. This corresponds so far to the structure of the transistor of FIG. 1. The vias, gate and RESURF structures have not been shown for diagrammatic simplicity.

A deeper conductive structure 102 is provided at a position that, in the finished device would align with the end 43 of the field plate 42 or other RESURF structure. As noted above, the horizontal distance that qualifies as alignment to achieve the functionality described herein will depend upon the overall architecture and technology node. For the illustrated devices, for example, the end 43 of the RESURF structure may be within 0-3 μm of the conductive structure 102, or within about 0-2 μm. The implant 102 can be connected to a metal layer by way of a via so that it can be driven by a circuit to a voltage which may be a function of the drain-source voltage across the device. The implanted region 102 may be actively driven to a potential by one or more further transistors formed within the integrated circuit, by the use of a potential divider, or even by an externally supplied voltage.

From the above description, it can be seen that the breakdown voltage of a device can be improved by changing the direction of the electric field at a specific area of an interface between a semiconductor and a dielectric where charge trapping may be expected to result in degradation of the breakdown performance. In the embodiments described so far this has been achieved by the formation of a single conductive structure that employs the current carrying regions of the device so as to form a modified electric field within a specific portion of the device. However the present invention is not limited to devices having only a single electric field modifying structure.

Figure 13:
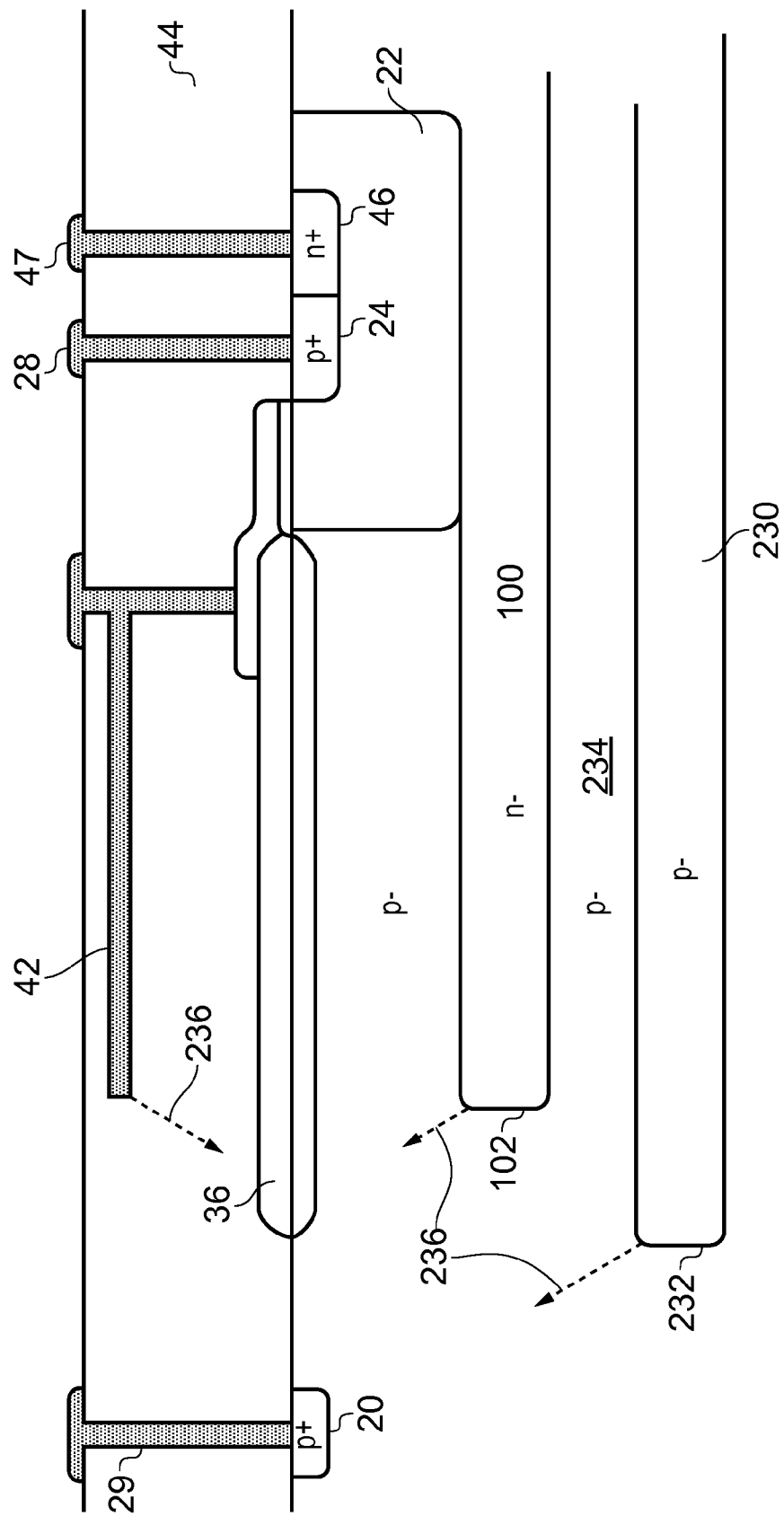
FIG. 13 is a schematic cross section through an embodiment having two buried electric field modification structures, the structures being isolated from one another such that they can be driven to respective potentials.

FIG. 13 is a cross section through a further embodiment which is similar to that shown in FIG. 5 but which has a further modifying structure 230 having an end portion 232 disposed beneath the first modifying structure 100. The further modifying structure 230 has a greater spatial extent than the structure 100, and hence extends farther from the channel region 22 so as to be closer to the drain 20. In use the first and second electric field modifying structures 100, 230 can be driven to different potentials. Thus, as shown, the first structure 100 is connected to the source voltage of the transistor, whereas the second structure 230 is not connected to the source and may be driven to a different voltage, or indeed the same voltage, via connections and circuits (not shown). In the arrangement shown in FIG. 13 the second electric field modifying structures 100, 230 are separated from one another by a region of the bulk semiconductor material, this region being designated 234 in FIG. 13. E-field directions are schematically illustrated by the broken arrows 236.

Figure 14:
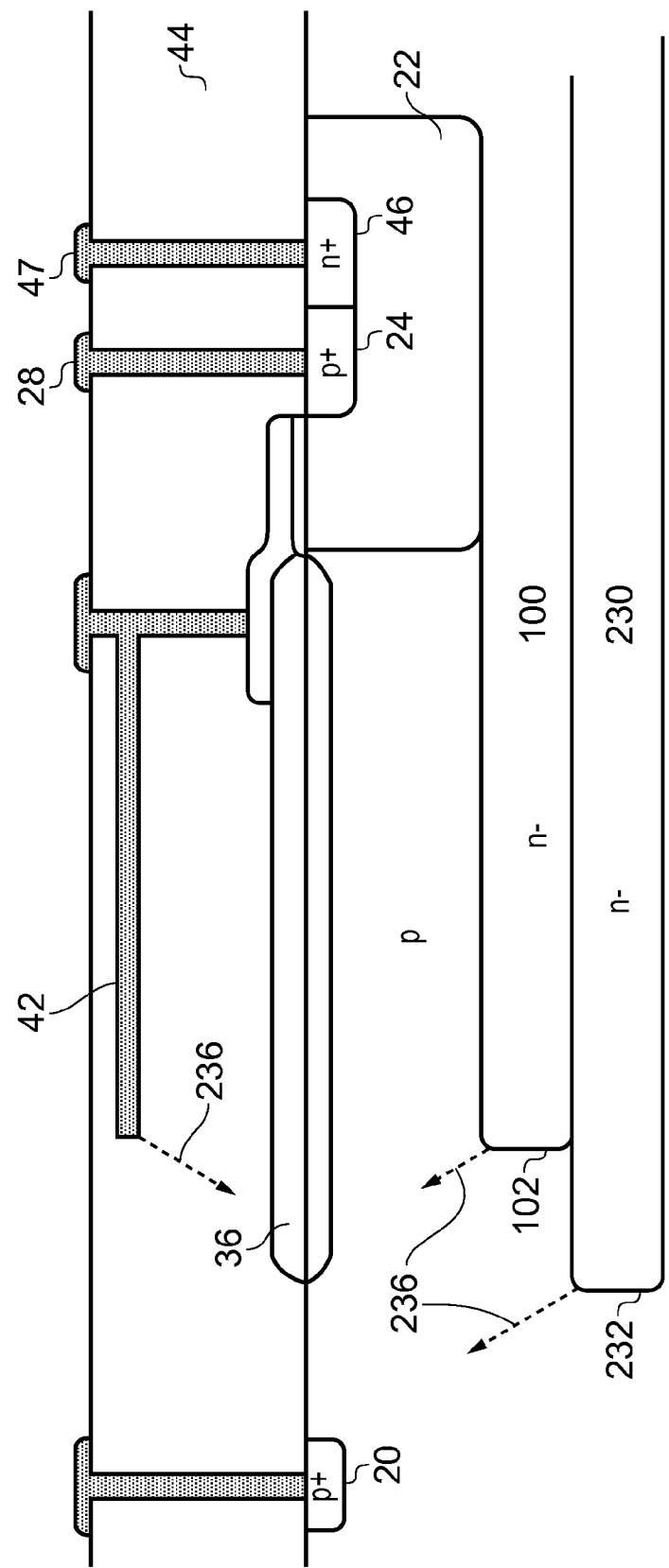
FIG. 14 is a cross section through another embodiment having two buried electric field modification structures, the structures being in contact such that portions of them are at the same potential.

FIG. 14 shows an arrangement which is similar to that of FIG. 13 in that first and second field modification structures in the form of conductive structures 100 and 230 are provided but in this arrangement they are not separated from each other, lacking the separating region 234 of FIG. 13. Thus both structures 100 and 230 are connected to the same potential in the region of the channel, but each end portion 102 and 232 can float to a respective voltage by virtue of its potential divider action with the drain 20.

Figure 15:
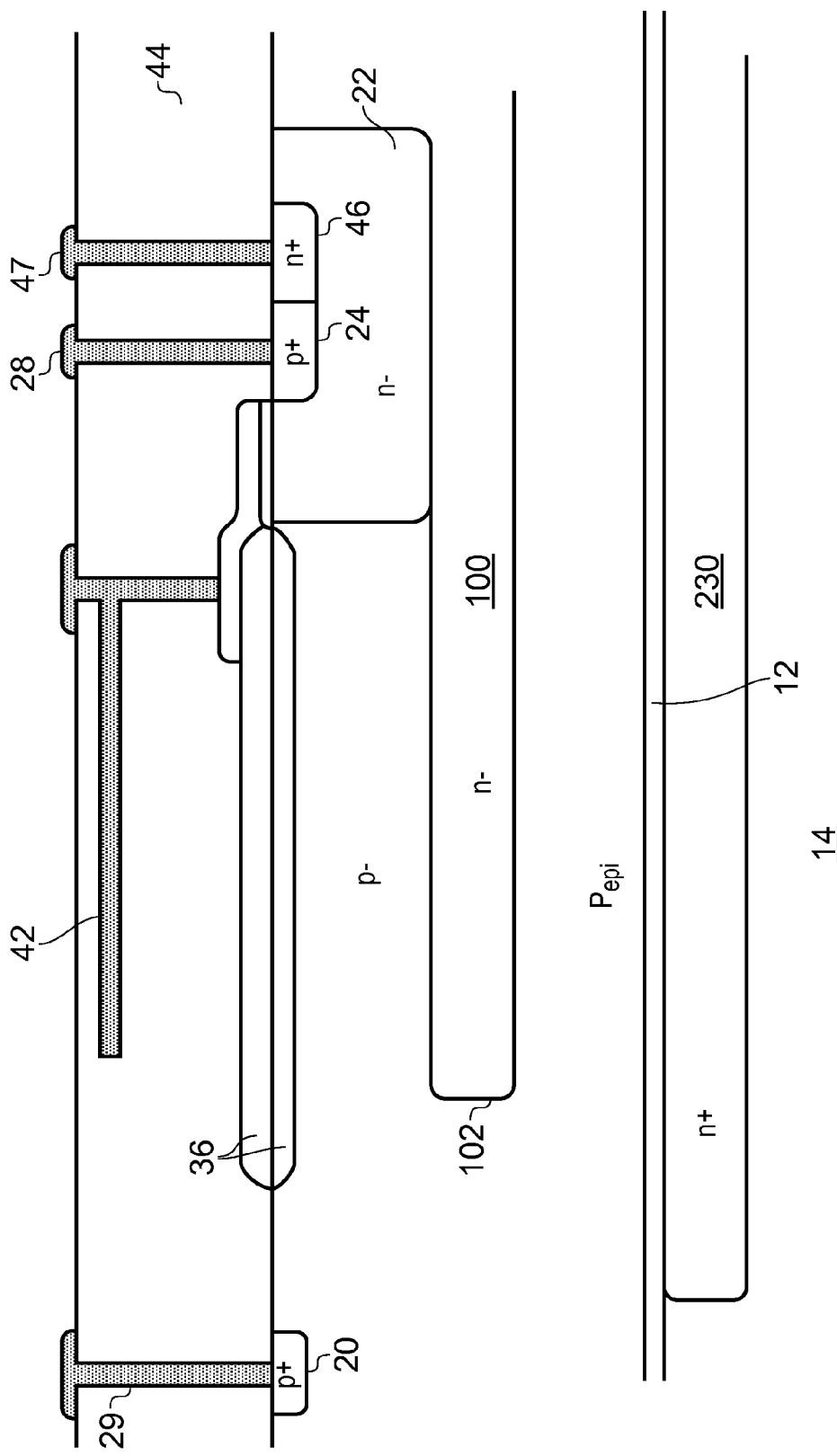
FIG. 15 is a cross section through a further embodiment having two field modification structures.

FIG. 15 shows a further variation on the arrangement shown in FIG. 13, where the second conductive structure 230 has been provided beneath the insulating layer 12 provided on the handle wafer 14 of a silicon on insulator device. The second conductive structure 230 may be biased by a separate connection made to the handle wafer by any suitable connection means.

Figure 16:
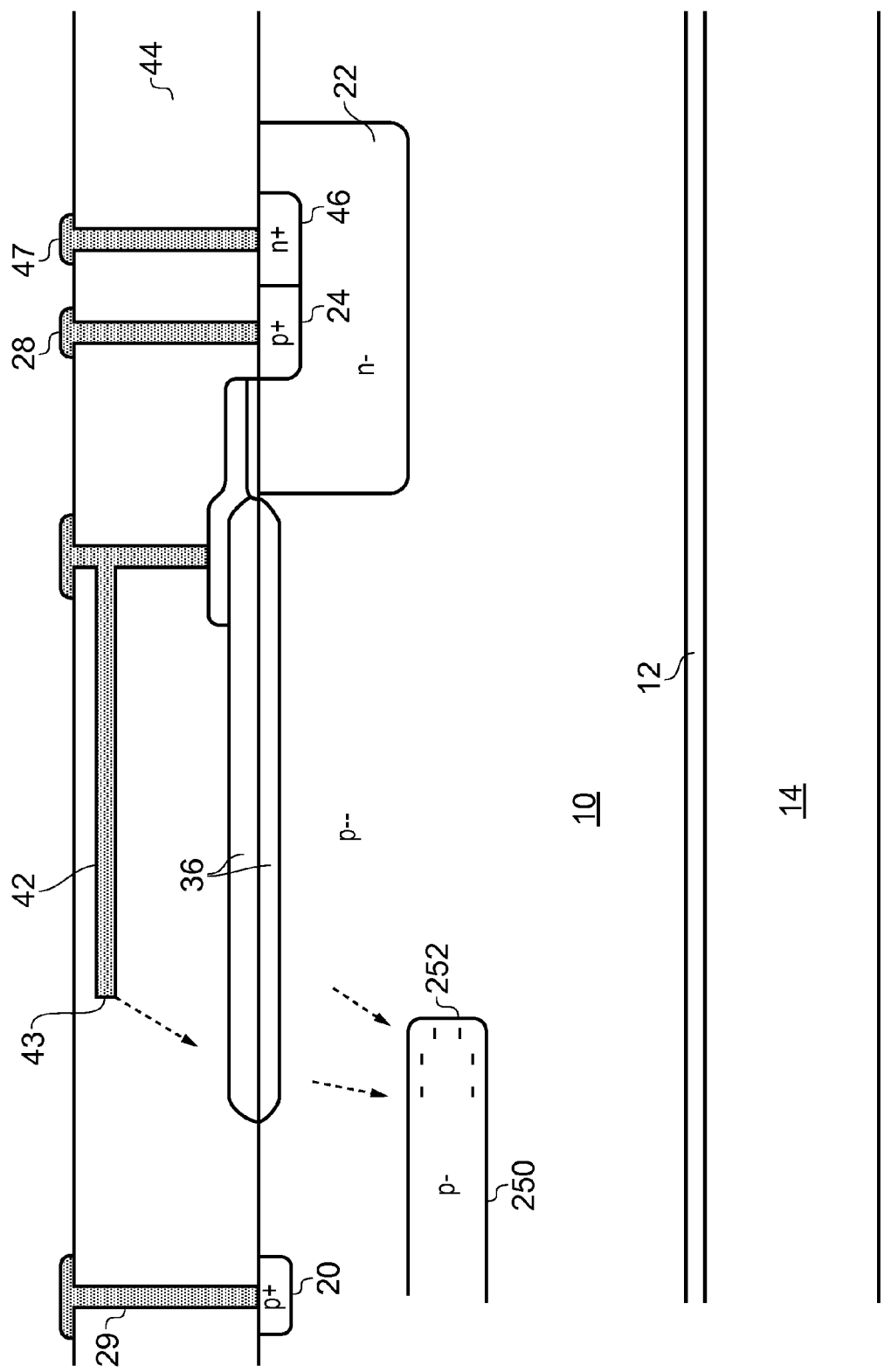
FIG. 16 is a cross section through a further embodiment.

FIG. 16 shows a further embodiment, which in many ways is similar to FIG. 5 in that a first conductive structure 250 having an end region 252 is formed beneath the device, and the end region 252 is substantially aligned or in the vicinity of an end portion 43 of the field plate 42. However the conductive structure 250 is no longer connected to the N-type region 22 that forms the channel. The conductive structure 250 is, in this example, formed of a lightly doped P-type region rather than an N-type semiconductor region such that it can be connected to a negative voltage compared to the potential of the bulk region 10 of the semiconductor. As with the prior examples of lightly doped regions, the concentration will depend upon the overall architecture and technology node. In this example, the conductive structure 250 may have a doping concentration between about $1\times10^{15}$ and $5\times10^{17}$ atoms/cm$^3$. Thus, region 250 could be connected to the drain potential via a suitable contact, could be connected to the drain by extending the drain region 20 downwardly to contact the region 250, or may be allowed to float or be driven to a potential intermediate that of the drain and the source potential.

Figure 17:
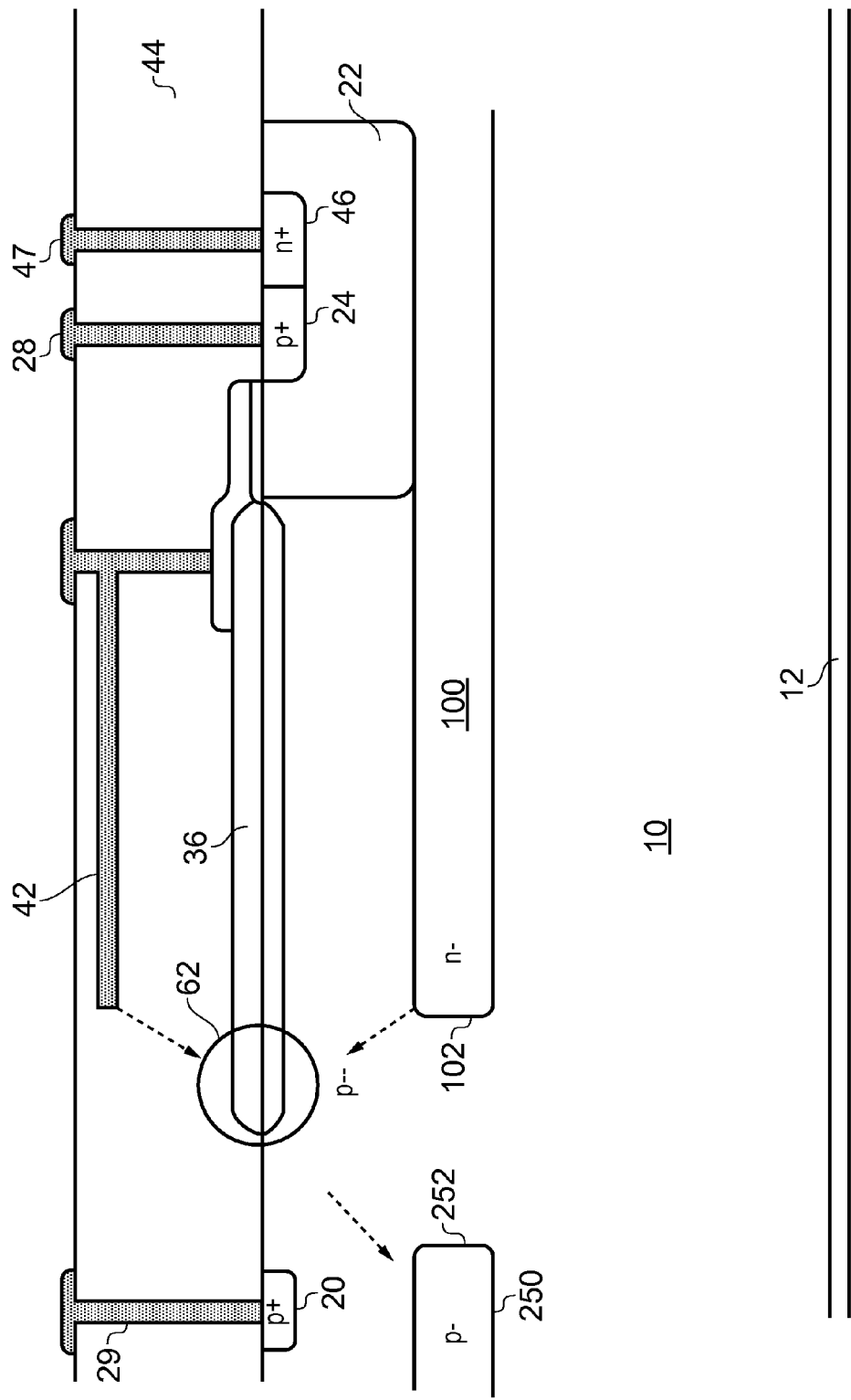
FIG. 17 is a cross section through yet a further embodiment.

FIG. 17 shows a further variation in which the embodiments of FIG. 16 and FIG. 5 are combined such that the device has two conductive structures, the first conductive structure 100 being as hereinbefore described with respect to FIG. 5 and the second conductive structure 250 being as described with respect to FIG. 16. The relative positions and potentials of the conductive structures 250 and 100 can be modified to vary their contribution to the E-field vector in the region 62 adjacent the end of the field plate 42.

Figure 18:
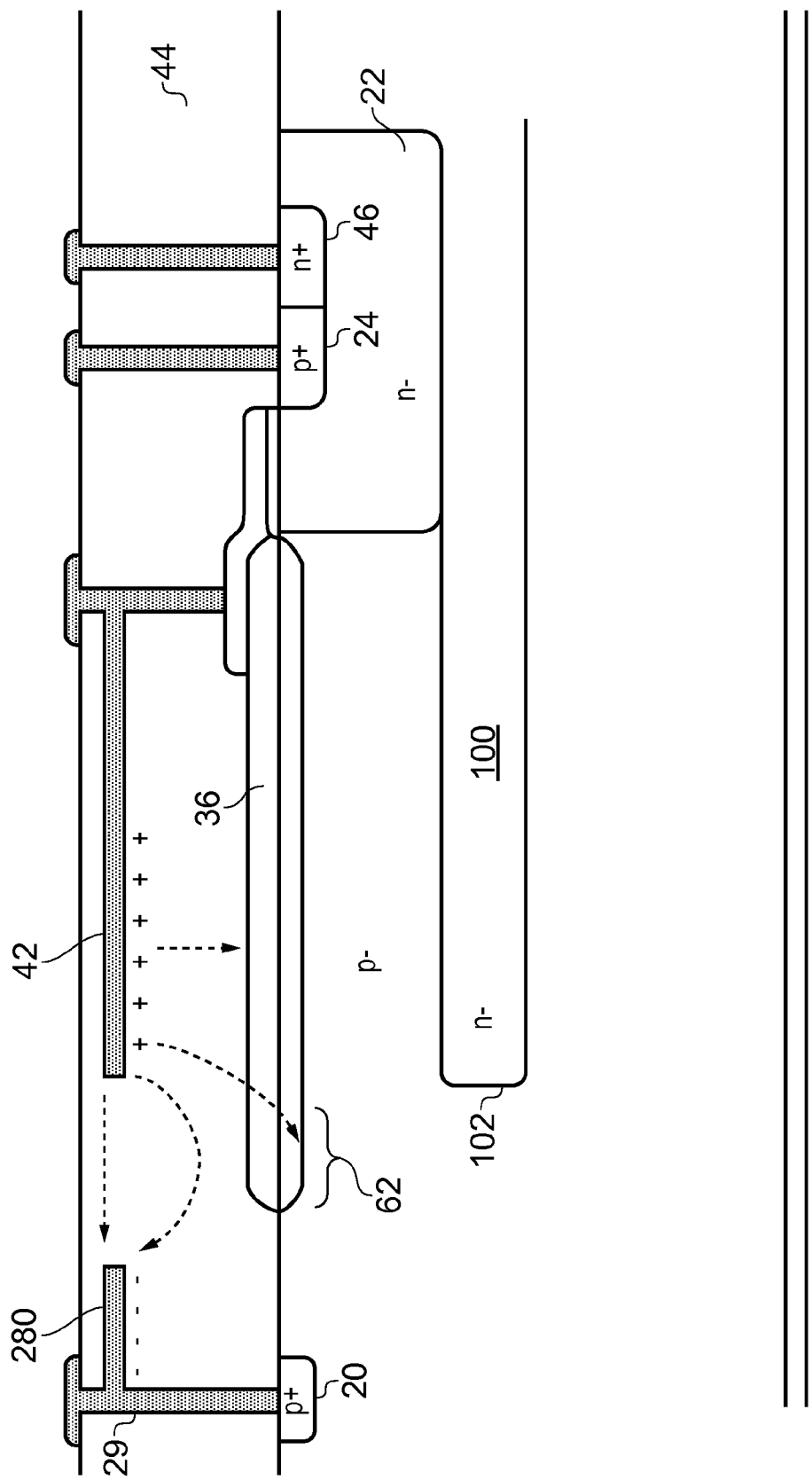
FIG. 18 is a cross section through an embodiment having a correction structure fabricated near a field plate.

FIG. 18 shows a further variation in which a second field plate like structure 280 is formed opposite the field plate 42, but the structure 280 is connected to the drain potential. Thus, as shown, looping lines of electric field exist between the end of the field plate 42 and the end of the second field plate 280 and these lines of E-field can modify the electric field direction at the interface region 62 beneath the end of the field plate 42. This structure may be used on its own or, as shown in FIG. 18, in combination with one or more of the buried electric field modification structures, such as structure 100 which is shown and has been described hereinbefore, and optionally in combination with structures 230 or 250 also as described hereinbefore.

Figure 19A:
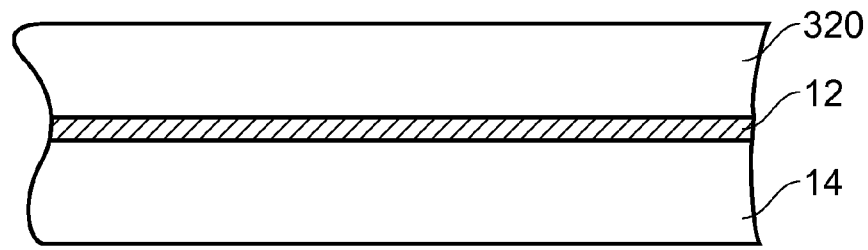
FIGS. 19a to 19c show a sequence of processing steps that may be used to form a field modification structure within a semiconductor wafer as part of a larger sequence of processing steps used to form a FET.
Figure 19B:
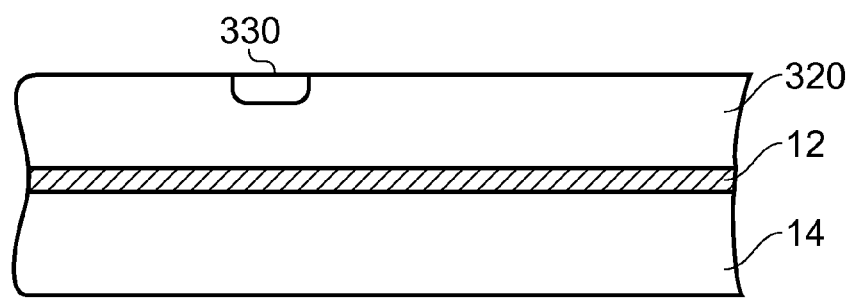
Figure 19C:
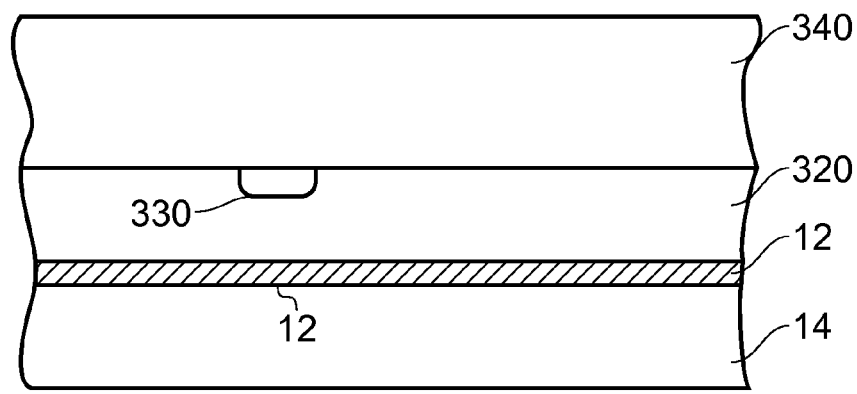

The conductive structure can be formed by a relatively simple modification to the process steps that are used to form the transistor. FIG. 19a shows a typical starting point for a Silicon On Insulator (SOI) process, where a handle wafer 14 has an oxide layer 12 over it, and a further layer of silicon 320 is formed over the oxide layer, for example by vapor phase deposition, or by adhering two silicon wafers together. The wafers may be formed with a light P type doping. Next the wafer may be masked, and selectively etched, so as to reveal an aperture through which a dopant is implanted to form an N type region 330, as shown in FIG. 19b. Next more silicon 340 is deposited over the surface of layer 320 so as to bury the region 330 as shown in FIG. 19c. The silicon 330 may be formed as an epitaxial layer. Once layer 330 has been formed, the usual processing steps to form the transistor are undertaken. In the finished device the region 330 forms the conductive structure 100 (and the conductive structure boundary region 102) and is aligned with the edge of the RESURF structure.

It is thus possible to provide a device having an improved breakdown performance and little or no variation with use of its breakdown voltage.

What is claimed is:

1. A semiconductor device comprising:
   a first layer adjoining a semiconductor layer;
   a reduced surface field (RESURF) structure located adjacent a surface of the semiconductor layer, the RESURF structure having a first boundary region; and
   a field modification structure having a boundary region substantially aligned with the first boundary region, the field modification structure being electrically connected to a voltage source and positioned such that at least a portion of the semiconductor layer is between the first layer and the field modification structure,
   wherein, in use, a potential at the field modification structure causes an E-field vector at a region of an interface between the semiconductor layer and the first layer to be modified.

2. A semiconductor device as claimed in claim 1, wherein the field modification structure further comprises
   at least one component connected to the field modification structure to enable a voltage from the voltage source to be applied to the field modification structure.

3. A semiconductor device as claimed in claim 1, in which the field modification structure comprises a semiconductor material, and wherein the semiconductor layer has a different conductivity type than the semiconductor material.

4. A semiconductor device as claimed in claimed in claim 1, in which the semiconductor device comprises a field effect transistor, and the RESURF structure extends from a gate of the field effect transistor towards a drain of the field effect transistor.

5. A semiconductor device as claimed in claim 4, in which the field modification structure contacts a channel doping of the field effect transistor.

6. A semiconductor device as claimed in claim 5, in which a connection region between the first boundary region and the channel is less doped than the channel doping.

7. A semiconductor device as claimed in claim 1, in which the semiconductor device comprises a field effect transistor, and further comprising a circuit configured to bias a boundary region of the field modification structure to a bias voltage as a function of a potential difference between the drain and source or drain and gate of the field effect transistor.

8. A semiconductor device as claimed in claim 1, in which the RESURF structure comprises a field plate.

9. An integrated circuit including at least one semiconductor device as claimed in claim 1.

10. A semiconductor device as claimed in claim 1, in which the field modification structure comprises a field plate connected, in use, to a high voltage node.

11. A semiconductor device as claimed in claim 10, in which the field plate is connected to a drain of a transistor, and extends towards a RESURF structure connected to the gate or a source of the transistor.

12. A semiconductor device as claimed in claim 1, in which the device comprises first and second field modification structures, each having a respective boundary region.

13. A semiconductor device as claimed in claim 12, in which the first and second field modification structures are provided at a similar depth within the semiconductor device.

14. A method of fabricating a semiconductor device as claimed in claim 1, the method comprising: forming a conductive region of the field modification structure by doping a region of a semiconductor that in a finished device will have a boundary substantially aligned with an edge of a RESURF structure; continuing to deposit semiconductor over and around the doped region; and forming a substantially horizontal device over the doped region.

15. A semiconductor device as claimed in claim 1, further comprising an insulator between the first layer and the RESURF, in which the first layer is a dielectric layer and the RESURF comprises a field plate.

16. A semiconductor device as claimed in claim 12, in which the first and second field modification structures are provided at different depths within the semiconductor device.

17. A semiconductor device as claimed in claim 12, in which the first and second field modification structures are at different potentials.

18. A semiconductor device as claimed in claim 12, in which the first and second field modification structures are at approximately the same potential.

19. The semiconductor device as claimed in claim 1, wherein the potential at the field modification structure causes an E-field vector at a region of the interface between the semiconductor layer and the first layer to become less inclined with respect to the interface between the semiconductor layer and the first layer.

20. The semiconductor device as claimed in claim 1, wherein the field modification structure is electrically connected to the voltage source by way of a conductive track.

21. The semiconductor device as claimed in claim 1, wherein the field modification structure is electrically connected to the voltage source by way of a channel doping.

* * * * *